United States Patent
Yoo

(10) Patent No.: US 10,117,306 B2
(45) Date of Patent: Oct. 30, 2018

(54) FLEXIBLE DISPLAY SUBSTRATE, MANUFACTURING METHOD THEREOF, AND FLEXIBLE DISPLAY DEVICE HAVING THE SAME

(71) Applicant: SAMSUNG DISPLAY CO., LTD., Yongin-si, Gyeonggi-do (KR)

(72) Inventor: Byung Han Yoo, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 66 days.

(21) Appl. No.: 14/829,516

(22) Filed: Aug. 18, 2015

(65) Prior Publication Data

US 2016/0227623 A1    Aug. 4, 2016

(30) Foreign Application Priority Data

Feb. 4, 2015  (KR) .................. 10-2015-0017526

(51) Int. Cl.
*G02F 1/1333* (2006.01)
*H05B 33/14* (2006.01)
*H05B 33/26* (2006.01)
*H05B 33/10* (2006.01)

(52) U.S. Cl.
CPC ..... *H05B 33/145* (2013.01); *G02F 1/133305* (2013.01); *H05B 33/10* (2013.01); *H05B 33/26* (2013.01)

(58) Field of Classification Search
CPC ................................................ G02F 1/133305
USPC ......................................................... 313/511
See application file for complete search history.

(56) References Cited

U.S. PATENT DOCUMENTS

| | | | |
|---|---|---|---|
| 6,316,278 B1 * | 11/2001 | Jacobsen | G02F 1/1345 257/E21.705 |
| 7,787,097 B2 * | 8/2010 | Satoh | G02F 1/133305 349/158 |
| 8,217,381 B2 | 7/2012 | Rogers et al. | |
| 2002/0139981 A1 * | 10/2002 | Young | G02F 1/133305 257/72 |

(Continued)

FOREIGN PATENT DOCUMENTS

| | | | |
|---|---|---|---|
| JP | 2002116438 A | * 4/2002 | ....... G02F 1/133305 |
| KR | 2002-0029566 A | 4/2002 | |

(Continued)

OTHER PUBLICATIONS

Libanori, R., et. al., Stretchable heterogeneous composites with extreme mechanical gradients, Nature Communications, Dec. 11, 2012, pp. 1-9, DOI: 10.1038/ncomms2281, Macmillan Publishers Limited.

*Primary Examiner* — Christopher Raabe
(74) *Attorney, Agent, or Firm* — Lewis Roca Rothgerber Christie LLP

(57) ABSTRACT

A flexible display device includes: a display substrate including a plurality of protrusion portions and a plurality of recess portions at one surface thereof and curved surfaces respectively extending between ones of the plurality of protrusion portions towards a center of an adjacent one of the plurality of recess portions; a pixel unit configured to emit light on the display substrate; a first wiring coupled to the pixel unit and elongated in a first direction; and a second wiring elongated in a second direction crossing the first direction.

24 Claims, 11 Drawing Sheets

(56) References Cited

U.S. PATENT DOCUMENTS

| | | | | |
|---|---|---|---|---|
| 2004/0124763 A1* | 7/2004 | Nathan | ............... | H01L 27/3244 |
| | | | | 313/498 |
| 2006/0222971 A1* | 10/2006 | Seo | ......................... | B29C 59/14 |
| | | | | 430/7 |
| 2007/0222935 A1* | 9/2007 | Belyaev | .............. | G02F 1/13392 |
| | | | | 349/155 |
| 2012/0258573 A1* | 10/2012 | Yan | ...................... | H05K 3/0014 |
| | | | | 438/113 |
| 2012/0286264 A1* | 11/2012 | Suzuki | ................ | H01L 27/1225 |
| | | | | 257/43 |
| 2014/0217383 A1* | 8/2014 | Park | ......................... | H01L 51/56 |
| | | | | 257/40 |
| 2014/0333988 A1* | 11/2014 | Lee | ......................... | G02B 5/201 |
| | | | | 359/296 |
| 2015/0034977 A1* | 2/2015 | Yaguchi | ............ | G02F 1/133305 |
| | | | | 257/88 |
| 2015/0043174 A1* | 2/2015 | Han | .................... | G02F 1/13452 |
| | | | | 361/749 |
| 2015/0060870 A1* | 3/2015 | Ro | ...................... | H01L 27/1218 |
| | | | | 257/72 |
| 2015/0282295 A1* | 10/2015 | Matsumoto | .............. | H05K 3/14 |
| | | | | 361/749 |

FOREIGN PATENT DOCUMENTS

| KR | 10-0304165 B1 | 11/2002 |
|---|---|---|
| KR | 10-2006-0064318 A | 6/2006 |

* cited by examiner

FLEXIBLE DISPLAY SUBSTRATE, MANUFACTURING METHOD THEREOF, AND FLEXIBLE DISPLAY DEVICE HAVING THE SAME

CROSS-REFERENCE TO RELATED APPLICATION

This application claims priority to and the benefit of Korean Patent Application No. 10-2015-0017526, filed in the Korean Intellectual Property Office on Feb. 4, 2015, the content of which is incorporated herein by reference in its entirety.

BACKGROUND

1. Field

The described technology relates generally to a display device. More particularly, the described technology relates generally to a flexible display substrate capable of being bent, expanded, and/or contracted by an external force, a manufacturing method thereof, and a flexible display device including the same.

2. Description of the Related Art

A display device visually displays data, and in general, displays results of processing of a computer on a screen to be viewed directly by the eye as a computer output device. The display device may include a cathode ray tube (CRT), a liquid crystal display (LCD), an organic light emitting diode (OLED) display, or an electrophoretic display (EPD) and is not limited to the function as the computer output device but has evolved to be variously applied to applications in fields of television receivers, portable communication equipment, wearable electronic devices, and the like.

Among the display devices, flat panel display devices, such as the liquid crystal display, the organic light emitting diode display, the electrophoretic display, etc., that may be easily manufactured to be large-sized, thin, and light-weight are leading the display industry. Furthermore, by applying flexible or elastic materials as a substrate, a flexible display device which may be bendable, rollable, stretchable, and/or compressible by an external force has been researched.

In the flexible substrate applied to the flexible display device, stretchability in a portion in which a light-emitting element forming a pixel and a pixel circuit driving the light-emitting element are formed should be suppressed or reduced while elasticity in the peripheral portion should be maximized. However, it is difficult to manufacture one substrate to have different stretchability characteristics in a plurality of fine regions (e.g., small regions) with current processes, and stress control is difficult in an interface when a separate structure is attached to the substrate.

The above information disclosed in this Background section is only for enhancement of understanding of the background of the described technology and therefore it may contain information that does not form prior art.

SUMMARY

The present invention provides a flexible display substrate having a reliable structure by differentiating a direction of applied tensile stress in a pixel and a peripheral area thereof when stretching the substrate by forming a curved recess portion and a protrusion portion on the substrate.

The present invention also provides a flexible display device including a flexible display substrate in which the direction of the applied tensile stress is differentiated in the pixel and the peripheral area thereof when stretching the substrate by forming the curved recess portion and the protrusion portion on the substrate.

The present invention further provides a method of manufacturing a flexible display substrate having a curved recess portion and a protrusion portion on the substrate to differentiate a direction of applied tensile stress in the pixel and the peripheral area thereof when stretching the substrate.

A flexible display device according to an embodiment of the present invention includes: a display substrate including a plurality of protrusion portions and a plurality of recess portions at one surface thereof and curved surfaces respectively extending between ones of the plurality of protrusion portions toward a center of an adjacent one of the recess portions; a pixel unit configured to emit light on the display substrate; a first wiring coupled to the pixel unit and elongated in a first direction; and a second wiring elongated in a second direction crossing the first direction.

A slope of each of the curved surfaces may vary from the protrusion portion toward a center of the recess portion.

The slope of each of the curved surfaces may be smooth from the protrusion portion toward the center of the recess portion.

The pixel unit may be at least some of the protrusion portions of the display substrate.

The flexible display device may further include a pixel protection layer on the pixel unit.

The first wiring may be a gate wire connected to a gate electrode of a thin film transistor of the pixel unit.

The first wiring may be elongated along one of the curved surfaces of one of the recess portions.

The first wiring may be spaced from the one of the recess portions.

A portion of each of the curved surfaces may have a slope which is inclined in a direction away from a center of the one of the respective recess portion.

A center of at least one of the recess portions may have a planar surface.

Ones of the plurality of protrusion portions may have a height that is different from other ones of the plurality of protrusion portions.

The plurality of the protrusion portions of the display substrate may form the recess portions which extend in two directions.

The display substrate may have a plurality of regions, and ones of the plurality of protrusion portions in one of the plurality of regions may have different characteristics than ones of the plurality of protrusion portions in another one of the plurality of regions.

The plurality of regions may be arranged along a longitudinal direction.

The plurality of regions may include a first region extending across a center of the display substrate and a second region extending to an edge of the display substrate.

A flexible display substrate according to another embodiment of the present invention includes: a plurality of protrusion portions and a plurality of recess portions in one surface thereof and curved surfaces respectively extending from a boundary of the plurality of protrusion portions toward a center of an adjacent one of the plurality of recess portions.

Each of the curved surfaces may have a slope that varies in a direction from the boundary of one of the protrusion portions toward the center of a respective one of the recess portions.

The slope may be smooth.

The slope at a portion of each of the curved surfaces may be inclined in a direction away from the center of the respective one of the recess portions.

A center of at least one of the recess portions may be planar.

Ones of the plurality of protrusion portions may have different heights from each other.

The plurality of protrusion portions may be formed by the plurality of recess portions extending in two directions.

The flexible display substrate may have a plurality of regions, and at least two regions from among the plurality of regions may include ones of the plurality of protrusion portions and ones of the plurality of recess portions, respectively, having different characteristics.

The plurality of regions may extend in a longitudinal direction and may include a first region extending across a center of the flexible display substrate and a second region extending to an edge of the flexible display substrate.

The plurality of regions may include a first region extending across a center of the flexible display substrate and a second region extending to an edge of the flexible display substrate.

According to another embodiment of the present invention, a method of manufacturing a display substrate including a plurality of protrusion portions and a plurality of recess portions in one surface thereof and curved surfaces respectively extending between ones of the protrusion portions and a center of adjacent ones of the recess portions, includes: providing a stamping mold having a surface shape-coupled to the plurality of protrusion portions and the plurality of recess portions; coating and hardening polydimethylsiloxane (PDMS) on the stamping mold to form a PDMS substrate; and separating the hardened PDMS substrate from the stamping mold.

The providing of the stamping mold may include processing the shape-coupled surface by a mechanical process.

The method may further include, during the providing of the stamping mold, coating a photoresist layer on a base substrate; patterning the photoresist layer to remove portions corresponding to the plurality of protrusion portions; and reflowing and hardening the patterned photoresist layer.

According to the flexible display substrate according to an exemplary embodiment of the present invention, the curved recess portion and the protrusion portion are formed on the substrate to differentiate the direction of the applied tensile stress when stretching the substrate in the pixel and the peripheral region thereof, thereby providing a reliable structure.

Also, according to the flexible display device according to an exemplary embodiment of the present invention, the stretching is suppressed in the pixel unit including the light-emitting device and the pixel circuit and the stretching is increased or maximized at the peripheral area of the pixel such that a stretching effect of the display device may be obtained and the reliability of the elements, such as the light-emitting device and the pixel circuit, may be maintained.

According to the method of manufacturing the flexible display substrate according to an exemplary embodiment of the present invention, the flexible display substrate is manufactured by using the stamping mold having the shape corresponding to the curved recess portion and the protrusion portion, thereby easily manufacturing the display substrate having the desired shape.

DETAILED DESCRIPTION

Figure 1:
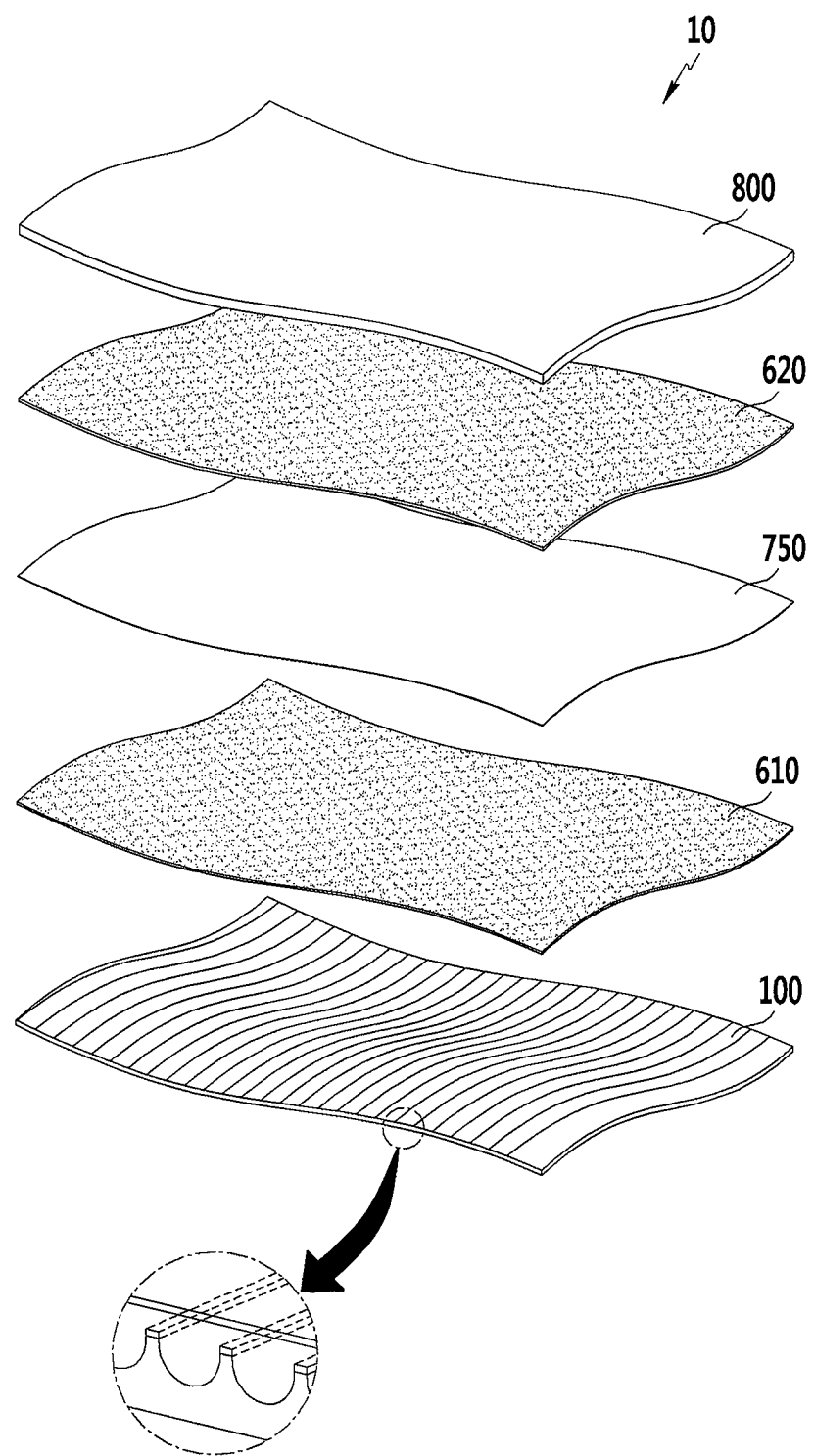
FIG. 1 is an exploded perspective view of a flexible display device according to an exemplary embodiment of the present invention.

Hereinafter, aspects of the present invention will be described more fully with reference to the accompanying drawings, in which exemplary embodiments of the present invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification. In addition, the size and thickness of layers and elements shown in the drawings may be arbitrarily shown for better understanding and ease of description, and the present invention is not limited thereto.

Further, when a first part is described as being arranged "on" a second part, this indicates that the first part is arranged at an upper side or a lower side of the second part without the limitation to the upper side thereof on the basis of the gravity direction. It will be understood that when an element or layer is referred to as being "on", "connected to", or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. As used herein, the term "and/or" includes any and all combinations of one or more of the associated listed items. Further, the use of "may" when describing embodiments of the present invention relates to "one or more embodiments of the present invention". Expressions, such as "at least one of," when preceding a list of elements, modify the entire list of elements and do not modify the individual elements of the list. Also, the term "exemplary" is intended to refer to an example or illustration.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments only and is not intended to be limiting of example embodiments. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Throughout this specification, unless explicitly described to the contrary, the words "include" and "comprise" and variations, such as "includes," "including," "comprises," and "comprising," will be understood to imply the inclusion of stated elements but not the exclusion of any other elements. As used herein, the singular forms "a" and "an" are intended to include the plural forms as well, unless the context clearly indicates otherwise.

Next, a flexible display substrate and a flexible display device including the same according to exemplary embodiments of the present invention will be described with reference to accompanying drawings.

FIG. 1 is an exploded perspective view of a flexible display device according to an exemplary embodiment of the present invention.

Referring to FIG. 1, a flexible display device 10 according to the present exemplary embodiment includes a display panel 100 and a touch screen panel 750 covered by a window substrate 800. The flexible display device 10 may be divided into a display area for displaying an image and non-display area including a driving circuit portion and/or a frame. The touch screen panel 750 is on (e.g., attached to) the display panel 100, and the window substrate 800 is on (e.g., attached to) the touch screen panel 750, thereby covering the display panel 100 and the touch screen panel 750.

The display panel 100 includes a plurality of pixels arranged in a matrix for displaying an image and, in the present exemplary embodiment, may be made of an organic light emitting panel. The display panel 100 includes a flexible substrate having a flexible characteristic, such that it can be curved and/or bendable, foldable, rollable, and/or stretchable.

A lower protection film may be provided under the display panel 100 to protect the display panel 100. The lower protection film may be made of a flexible plastic film, for example, PI (polyimide) or PET (polyethylene terephthalate).

An optical film may be on (e.g., adhered to) the display panel 100, and as another example, the optical film may be positioned on the touch screen panel 750. The optical film may include a polarization film and/or a phase difference film. The polarization film may polarize light incident to a side of the display panel and a portion of the incident light that is reflected back from the display panel, and the phase difference film is disposed to be closer to the display panel than the polarization film (e.g., is disposed between the display panel and the polarization film) to control the phase of the incident light and the reflected light.

The touch screen panel 750 is on the display panel 100. When the optical film is on the display panel 100, the touch screen panel 750 is positioned on the optical film and a TSP adhesive layer 610 is interposed between the display panel 100 and the touch screen panel 750 such that the touch screen panel 750 may be adhered to the display panel 100. The TSP adhesive layer 610 may be made of an optically clear adhesive (OCA), may be an adhesive tape (e.g., may have an adhesive tape shape), or may be an adhesive material that is coated and then hardened.

The touch screen panel 750 may sense the position of a touch input from the outside, and because the window substrate 800 is on (e.g., coupled to) the touch screen panel 750, the touch screen panel 750 thereby senses the position of the touch on the window substrate 800. In the present exemplary embodiment, the touch screen panel 750 may be made of a panel that is driven as a capacitive type (e.g., the touch screen panel 750 may be a capacitive-type touch screen panel); however, the present invention is not limited thereto, and the touch screen panel 750 may be made of a panel that is driven as a resistive film type (e.g., the touch screen panel 750 may be a resistive-type touch screen panel), an ultrasonic type, or an infrared type, etc.

The window substrate 800 is formed to have a larger area than the display panel 100 and the touch screen panel 750, thereby covering the display panel 100 and the touch screen panel 750. A window adhesive layer 620 is interposed between the touch screen panel 750 and the window substrate 800, thereby adhering the window substrate 800 to the touch screen panel 750. The window adhesive layer 620 may be made of an optically clear adhesive (OCA), may be an adhesive tape, or may be an adhesive material that is coated and then hardened.

Figure 2:
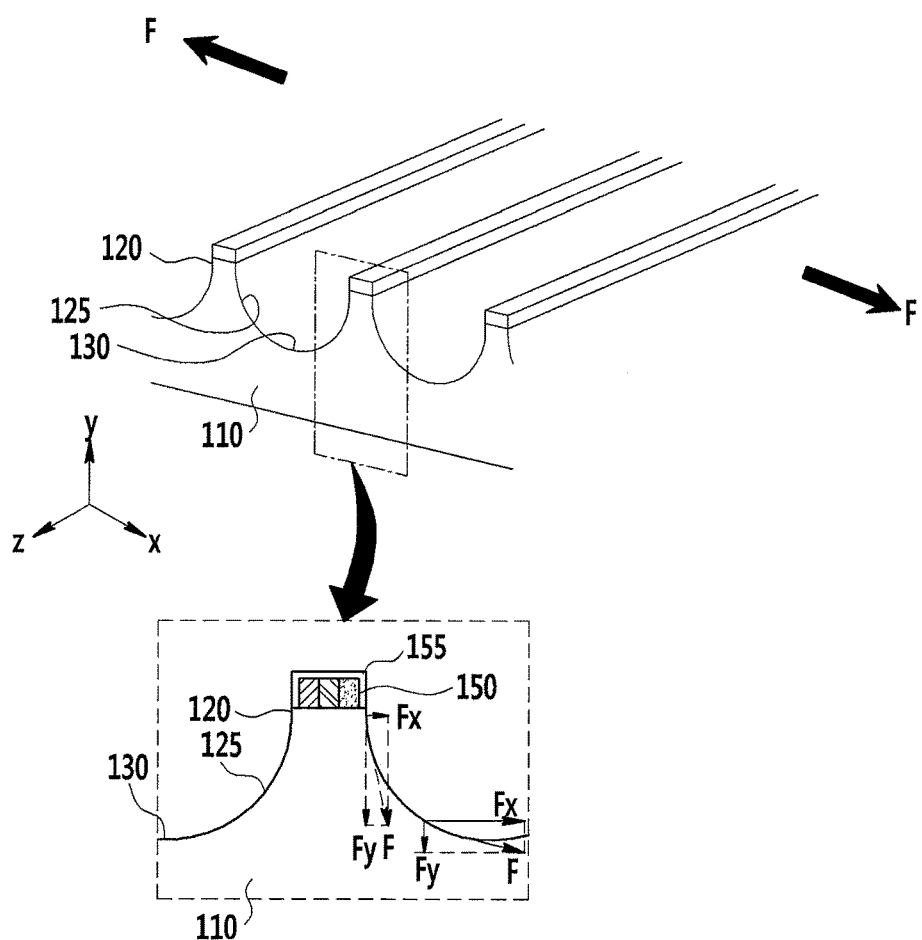
FIG. 2 is an enlarged perspective view and a partial enlarged front view of a portion of the display substrate shown in FIG. 1.

FIG. 2 is an enlarged perspective view and a partial enlarged front view of a portion of the display substrate shown in FIG. 1.

Referring to FIG. 2, a plurality of protrusion portions 120 and recess portions 130 are formed at one surface of a display substrate 110. The protrusion portions 120 and the recess portions 130 are connected to a curved surface 125 (e.g., a curved surface 125 extends between adjacent ones of the protrusion portions 120 and recess portions 130), and the curved surface 125 smoothly leads toward (e.g., extends toward) a center of the recess portion 130 from a boundary of an adjacent protrusion portion 120.

The curved surface 125 is formed having a slope in a direction from the protrusion portion 120 toward the center of the recess portion 130, and the slope is formed to be smooth from the boundary of the protrusion portion 120 toward the center of the recess portion 130.

When stretching the display substrate 110 in a right/left direction (an x-axis direction in FIG. 2) by applying a force F, a force applied to the surface near the boundary of the protrusion portion 120 and the center of the recess portion 130 may be the same as the force F. However, because the slope of the curved surface 125 is relatively great (e.g., sharp) near the boundary between the protrusion portion 120 and the curved surface 125, a component Fx in an x-axis direction of the force F is smaller than a component Fy in a y-axis direction of the force F. Furthermore, because the slope near the center of the recess portion 130 is relatively small (e.g., smooth), the component Fx in the x-axis direction of the force F is greater than the component Fy of in y-axis direction of the force F near the center of the recess portion 130. Accordingly, the force Fx acting parallel to the stretching direction of the display substrate 110 (the x-axis direction in FIG. 2) is relatively small near the boundary of the protrusion portion 120, and the force Fx acting in the direction parallel to the stretching direction of the display substrate 110 is relatively great near the center of the recess portion 130. Therefore, the stretching of the display substrate 110 may be reduced or suppressed near the protrusion portion 120, and because the display substrate 110 is relatively thin in the recess portion 130, the stretching of the display substrate 110 may be increased or improved at the recess portion 130.

Figure 3:
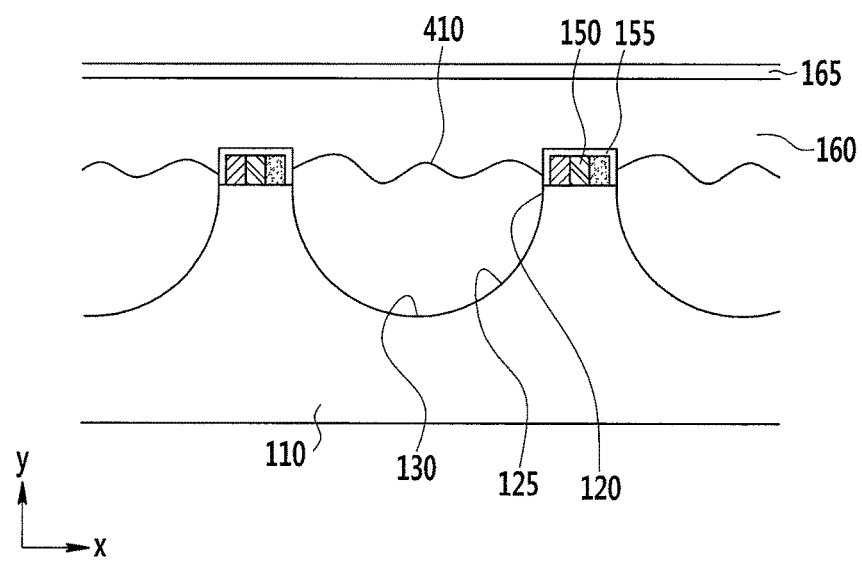
FIG. 3 is a schematic front view showing a connection relation of a pixel and wiring formed in a flexible display substrate according to an exemplary embodiment of the present invention.

FIG. 3 is a schematic front view showing a connection relation of a pixel and wiring formed in a flexible display substrate according to an exemplary embodiment of the present invention.

Referring to FIG. 3, the display substrate 110 includes the protrusion portions 120 and the recess portions 130 formed in one surface and includes the curved surface 125 smoothly leading from the boundary of the protrusion portions 120 toward the center of adjacent recess portions 130. A pixel unit 150 is formed at least some of the protrusion portions 120, and a pixel protection layer 155 is formed to cover each of the pixel units 150 on the protrusion portions 120. A planarization layer 160 covering the protrusion portions 120 while filling the recess portions 130 is formed on the protrusion portions 120 which are formed with the pixel unit 150 and the recess portion 130 to provide a flat or substantially flat surface, and a cover layer 165 is further formed on the planarization layer 160.

A first wiring 410 passes through the pixel unit 150, is elongated in (e.g., extends in) the first direction (the x-axis direction in FIG. 3), and is formed in the recess portion 130. The first wiring 410 may be a gate wire connected to a gate electrode of a thin film transistor formed in the pixel unit 150 and connects adjacent pixel units 150 to each other. The first wiring 410, as shown in FIG. 3, may be formed to be spaced from (e.g., separated from) the curved surface 125; however, the first wiring 410 may be formed to be elongated along the curved surface 125 and the recess portion 130 as another example. The pixel unit 150 may include a light-emitting device including red (R), green (G), and/or blue (B) sub-pixels, and the light-emitting device may selectively emit light depending on (e.g., according to) the driving of the thin film transistor.

The display substrate 110 may be formed of polydimethylsiloxane (PDMS) to be flexible. The pixel protection layer 155 covering the pixel unit 150 on the protrusion portion 120 may be formed of a plastic material, such as polyimide (PI), and may have a function of protecting and fixing the pixel unit 150 to the upper surface of the protrusion portion 120 so as to not be stretched (e.g., may not be substantially stretched) when the display substrate 110 is stretched or elongated. The planarization layer 160 may cover the protrusion portion 120 while filling the recess portion 130 and may be a platinum-catalyzed silicone material having a low modulus (e.g., a low elastic modulus) in which a hardener ratio is lower than in the display substrate 110, such as PDMS or Ecoflex®. Ecoflex® is a registered trademark of BASF Aktiengesellschaft JOINT STOCK COMPANY, of Ludwigshafen, Germany and describes biodegradable unprocessed plastics. For example, when a ratio of the primary material, such as the PDMS, and the hardener of the display substrate 110 is 10:1, the planarization layer 160 may have a ratio of 20:1. The cover layer 165 may be formed to cover the planarization layer 160 and may be a thermoplastic material which is capable of molding freely into any suitable shape. The first wiring 410 is formed of a stretchable material such that it may be stretched in the elongation direction thereof and may be folded and unfolded in a random pattern (e.g., in a crooked pattern).

Figure 4:
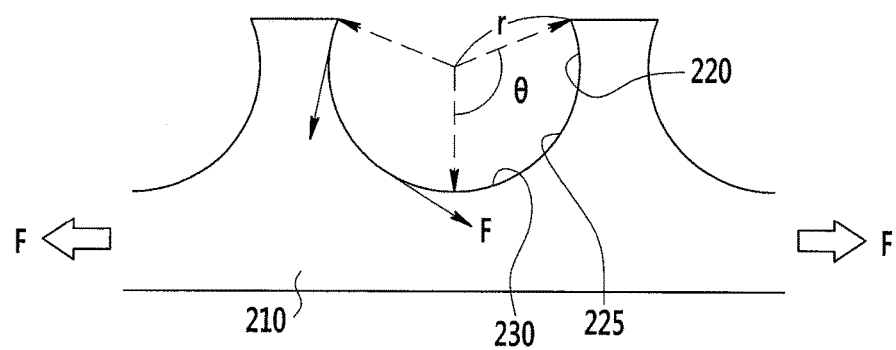
FIG. 4 is a front view of a flexible display substrate according to another exemplary embodiment of the present invention.

FIG. 4 is a front view of a flexible display substrate according to another exemplary embodiment of the present invention.

Referring to FIG. 4, a curved surface 225 of a display substrate 210 according to the present exemplary embodiment has a portion in which the slope at a boundary of a protrusion portion 220 is inclined in the direction away from a center of a recess portion 230. For example, when assuming a straight line contacts the curved surface 225 at the boundary of the protrusion portion 220, the straight line forms an angle that is less than 90 degrees with an upper surface of the protrusion portion 220. Also, the recess portion 230 and the curved surface 225 have the same curvature radius r, and a center angle θ measured between the boundary of the protrusion portion 220 and the center of the recess portion 230 with reference of the center of the curvature exceeds 90 degrees.

When a tensile force F acts in the right and left direction of the display substrate 210 as described above, the direction of the force acting on the surface near the boundary of the protrusion portion 220 may act in a direction opposite to the stretching direction of the display substrate 210 such that the stretching in the protrusion portion 220 may be further efficiently reduced or suppressed.

Figure 5:
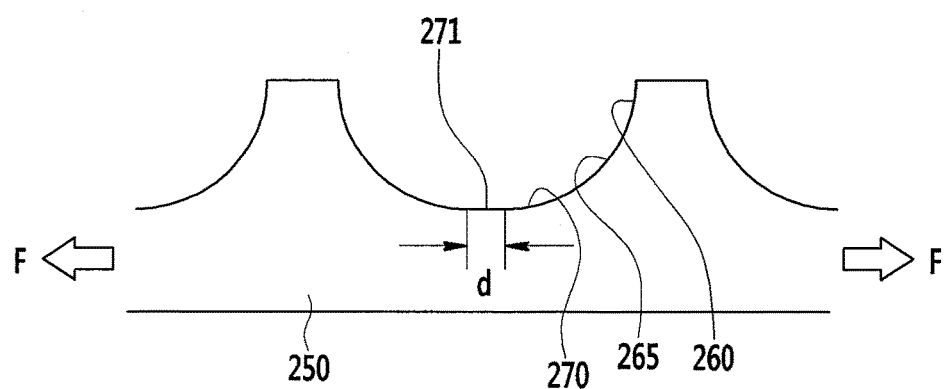
FIG. 5 is a front view of a flexible display substrate according to another exemplary embodiment of the present invention.

FIG. 5 is a front view of a flexible display substrate according to another exemplary embodiment of the present invention.

Referring to FIG. 5, a recess portion 270 formed in a display substrate 250 according to the present exemplary embodiment has a planarization surface 271 (e.g., a planar or flat surface) at a portion including a center of the recess portion 270 (e.g., at the portion that extends across the center of the recess portion 270). The planarization surface 271 is at a lowest portion (e.g., a bottom) of the recess portion 270 and is formed to be parallel to the other surface of the display substrate 250 in which the protrusion portion 260 is not formed. By controlling (e.g., varying) a width d of the planarization surface 271, a distance between adjacent protrusion portions 260 on which the pixel units are formed may be easily controlled.

Figure 6:
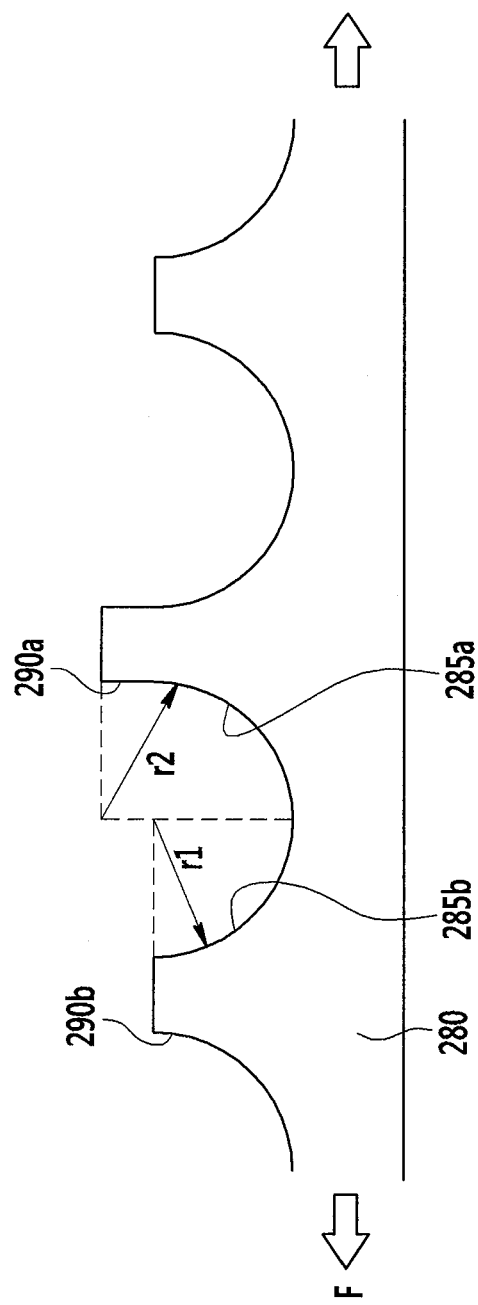
FIG. 6 is a front view of a flexible display substrate according to another exemplary embodiment of the present invention.

FIG. 6 is a front view of a flexible display substrate according to another exemplary embodiment of the present invention.

Referring to FIG. 6, a display substrate 280 according to the present exemplary embodiment may include protrusion portions 290a and 290b having different heights (e.g., having different heights above a bottom surface of the display substrate 280). For example, the protrusion portions 290a and 290b that are adjacent to each other may be formed to be different from each other, with the protrusion portion 290a having a greater height than the protrusion portion 290b. The protrusion portions 290a and 290b may be alternately disposed (e.g., alternately arranged).

Figure 7:
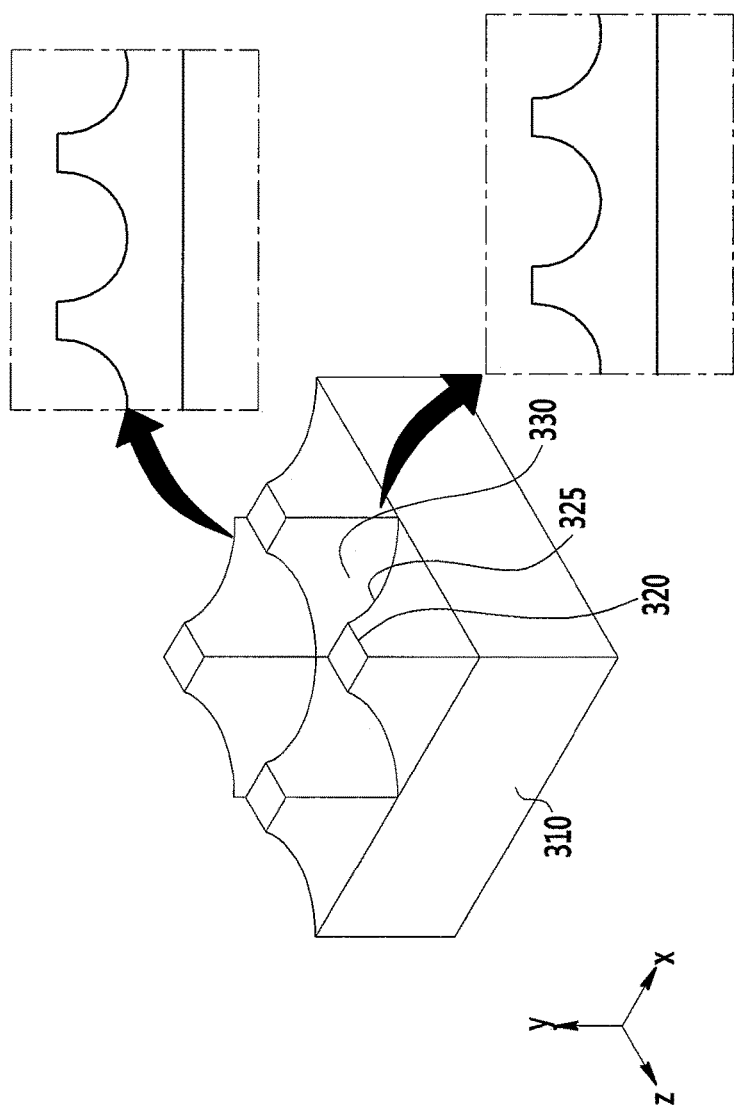
FIG. 7 is a perspective view of a flexible display substrate according to another exemplary embodiment of the present invention.
Figure 8:
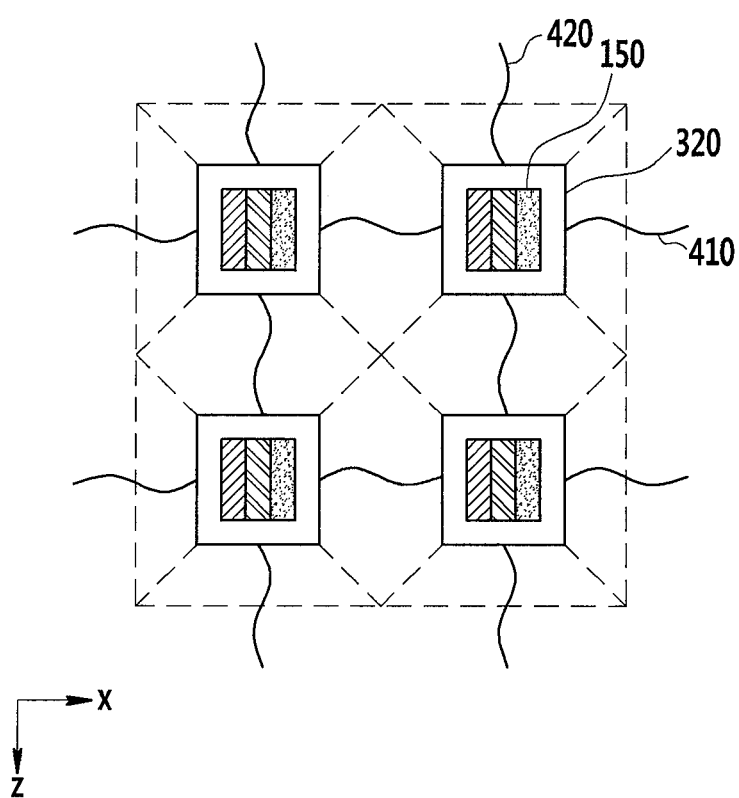
FIG. 8 is a schematic front view showing a connection relation of a pixel and wiring formed on the flexible display substrate shown in FIG. 7.

FIG. 7 is a perspective view of a flexible display substrate according to another exemplary embodiment of the present invention, and FIG. 8 is a schematic front view showing a connection relation of a pixel and wiring formed on the flexible display substrate shown in FIG. 7.

Referring to FIG. 7, a protrusion portion 320 of a display substrate 310 according to the present exemplary embodiment is surrounded by (e.g., a periphery of the protrusion portion 320 is surrounded by) a recess portion 330 formed in (e.g., extending in) four directions. For example, each protrusion portion 320 is independently formed and is arranged in a matrix in two directions, and the recess portion 330 is respectively formed between adjacent ones of the protrusion portions 320.

Referring to FIG. 8, the pixel unit 150 may be respectively disposed on each protrusion portion 320, and the pixel unit 150 may be connected to a first wiring 410 elongated in the first direction (the x-axis direction in FIG. 8) and a second wiring 420 elongated in the second direction (the z-axis direction in FIG. 8). In one embodiment, the first wiring 410 may be the gate wire connected to the gate electrode of the thin film transistor formed in the pixel unit, and the second wiring 420 may be the data wire connected to the source electrode of the thin film transistor.

Figure 9:
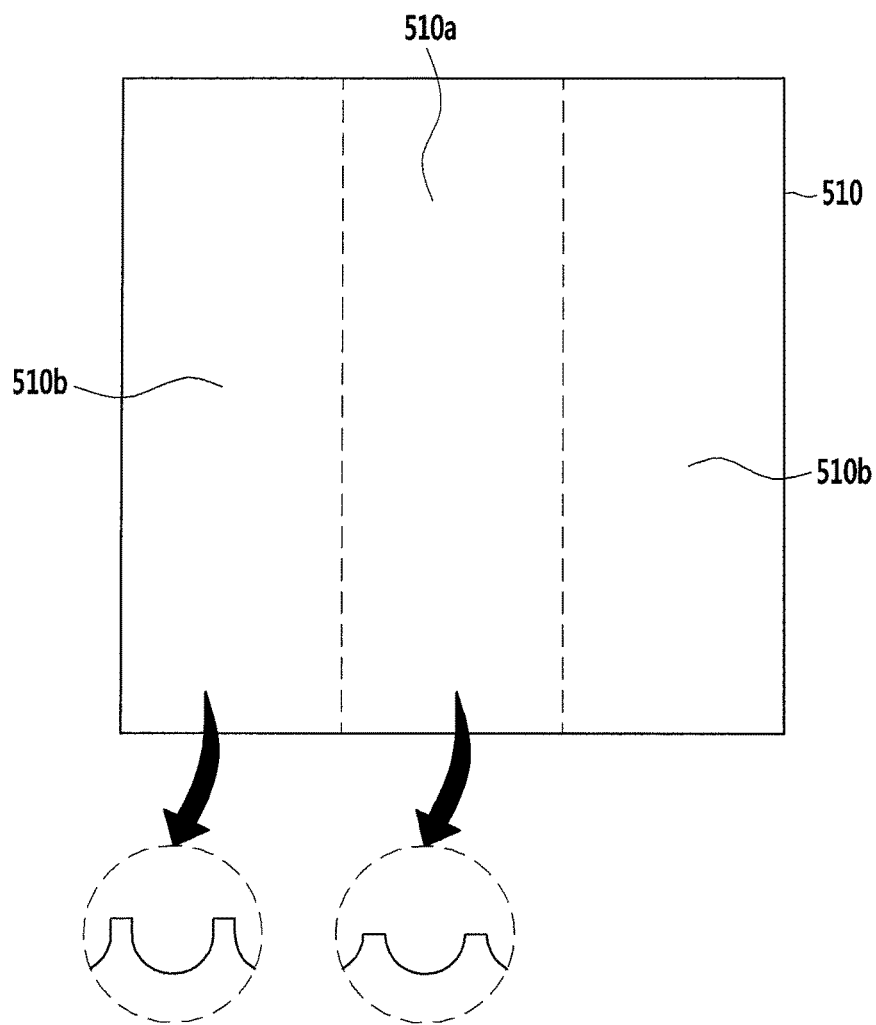
FIG. 9 is a top plan view of a flexible display substrate according to another exemplary embodiment of the present invention.

FIG. 9 is a top plan view of a flexible display substrate according to another exemplary embodiment of the present invention.

The display substrate 510 according to the present exemplary embodiment is divided into a plurality of regions, and at least two regions from among the plurality of regions may be formed to have different protrusion portions and recess portions. For example, as shown in FIG. 9, the display substrate 510 is divided into a plurality of regions 510a and 510b in a longitudinal direction, and may include a first region 510a including (e.g., extending across) a center of the display substrate 510 and a second region 510b including (e.g., extending to) an edge of the display substrate 510. The protrusion portion and the recess portion having different characteristics may be formed in the divided first region 510a and second region 510b (e.g., the protrusion portions and the recess portions formed in the first region 510a and the second region 510b, respectively, may have different characteristics).

For example, a height of the protrusion portion formed in the first region 510a may be less than a height of the protrusion portion formed in the second region 510b, and the planarization portion may be formed in the recess portion formed in the first region 510a. As described above, by differentiating the characteristics of the protrusion portion and the recess portion depending on the region, each region may have a different elasticity modulus (e.g., may be stretchable to a different degree).

Figure 10:
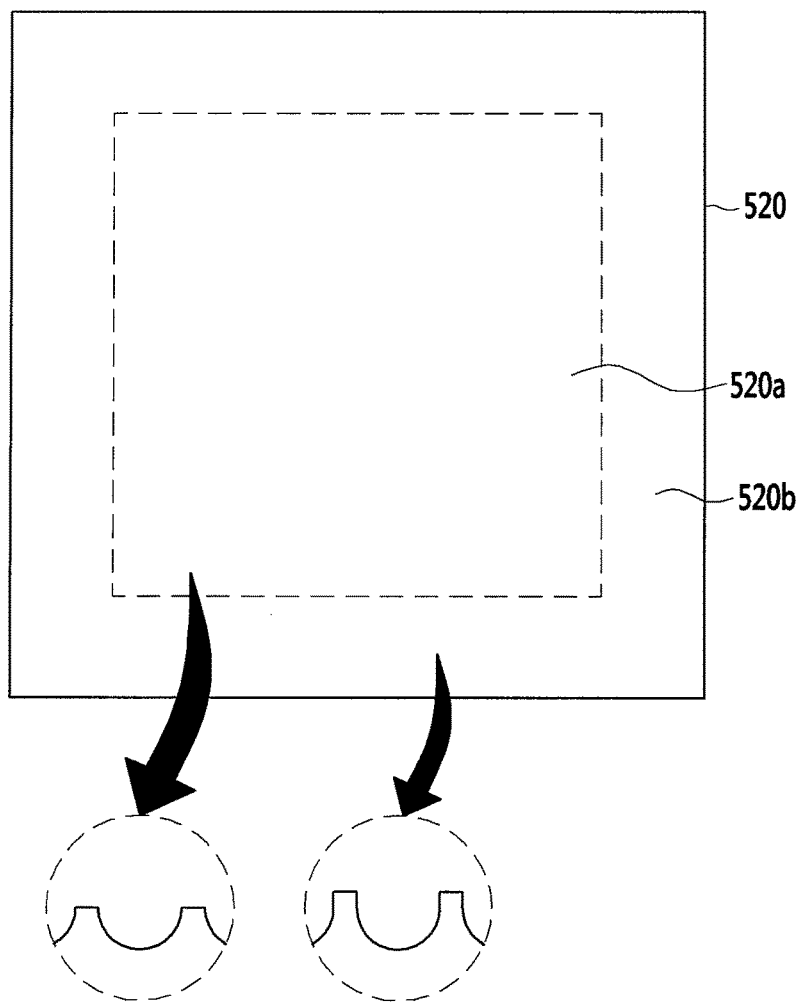
FIG. 10 is a top plan view of a flexible display substrate according to another exemplary embodiment of the present invention.

FIG. 10 is a top plan view of a flexible display substrate according to another exemplary embodiment of the present invention.

Referring to FIG. 10, a display substrate 520 according to the present exemplary embodiment is divided by a closed curve line including a center of the display substrate 520. The display substrate 520 may include a first region 520a including the center of the display substrate 520 and a second region 520b at a enclosing (e.g., surrounding) the first region 520a and the including an edge of the display substrate 520. The protrusion portions and the recess portions formed in the divided first region 520a and second region 520b, respectively, may have different characteristics from each other.

For example, the height of the protrusion portion formed in the first region 510a may be less than the height of the protrusion portion formed in the second region 510b, and the planarization portion may be formed in the recess portion formed in the first region 510a. As described above, by differentiating the characteristics of the protrusion portion and the recess portion depending on the region, each region may have a different elasticity modulus (e.g., may be stretchable to a different degree).

Figure 11:
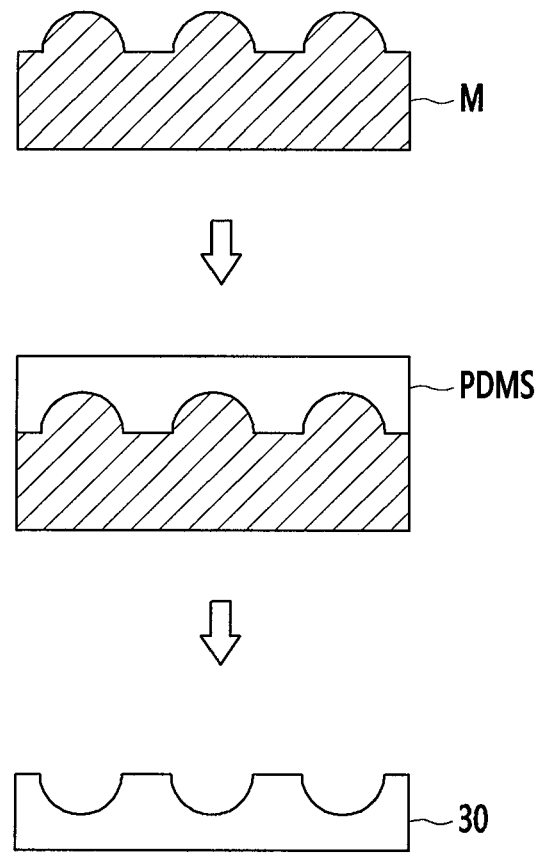
FIG. 11 is a process view showing a method of manufacturing a flexible display substrate according to an exemplary embodiment of the present invention.

FIG. 11 is a process view showing a method of manufacturing a flexible display substrate according to an exemplary embodiment of the present invention.

First, a stamping mold M (e.g., a stamper mold) having a shape-coupled surface for the protrusion portion and the recess portion is provided. Because the display substrate according to the present exemplary embodiment includes the plurality of protrusion portions and recess portions formed in one surface and the curved surface smoothly extending from the protrusion portion toward the center of the recess portion, the shape-coupled surface of the stamping mold M may have a structure including protrusions and depressions having a shape contrasting the shape-coupled surface (e.g., the surface of the stamping mold M may be the reverse of the desired surface of the display substrate to be formed thereon).

The stamping mold M can be manufactured by a mechanical process, such as milling. For example, the shape-coupled surface including the protrusion portion and the recess portion may be processed by a mechanical process.

Next, PDMS (polydimethylsiloxane) is coated and hardened on the stamping mold M to form a PDMS substrate.

Next, the hardened PDMS substrate is separated from the stamping mold M.

Accordingly, the separated PDMS substrate may be a display substrate 30 for inclusion in the display device. The manufactured display substrate 30 is formed having the plurality of protrusion portions and recess portions on one surface thereof and includes the curved surface smoothly leading from the protrusion portion toward the center of the recess portion.

Figure 12:
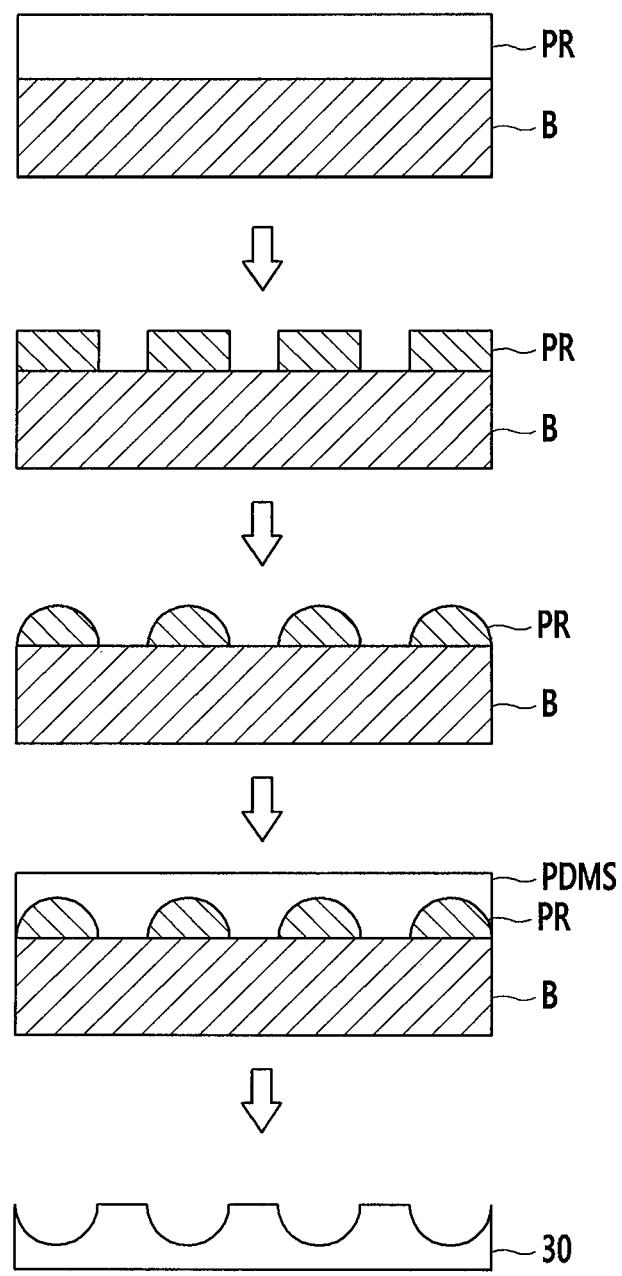
FIG. 12 is a process view showing a method of manufacturing a flexible display substrate according to another exemplary embodiment of the present invention.

FIG. 12 is a process view showing a method of manufacturing a flexible display substrate according to another exemplary embodiment of the present invention.

First, a stamping mold M having a shape-coupled surface for the protrusion portion and the recess portion is provided. In this embodiment, the stamping mold M may be prepared through a following process.

For example, a photoresist layer PR is coated on a base substrate B. The photoresist layer PR may be formed having a uniform thickness on the entire surface of the base substrate B.

Next, the photoresist layer PR is patterned to remove portions corresponding to the protrusion portions. The removed portions correspond to protrusion portions of the display substrate 30 that will be manufactured later.

Next, the patterned photoresist layer PR is reflowed and hardened. For example, the remaining portion of the patterned photoresist layer PR is deformed into a convex and rounded shape through the reflow process, and when the hardening process is performed, the protrusions and depressions contrasting the protrusion portion and the recess portion of the display substrate 30 that have been described herein are formed.

The PDMS is coated and hardened on the stamping mold as described above by using the stamping mold manufactured as described above to form the PDMS substrate, and the hardened PDMS substrate is separated from the stamping mold to manufacture the display substrate 30.

While this disclosure has been described in connection with what is presently considered to be practical exemplary embodiments, it is to be understood that the invention is not limited to the disclosed embodiments but is intended to cover various modifications and equivalent arrangements included within the spirit and scope of the appended claims and their equivalents.

| Description of Some Reference Symbols | |
|---|---|
| 10: flexible display device | 100: display panel |
| 110, 210, 250, 280: display substrate | 120, 220, 260: protrusion portion |
| 125, 225: curved surface | 130, 230, 270: recess portion |
| 150: pixel unit | 155: pixel protection layer |
| 160: planarization layer | 165: cover layer |
| 271: planarization surface | |

What is claimed is:

1. A flexible display device comprising:
   a display substrate comprising a plurality of protrusion portions and a plurality of recess portions at one surface thereof and curved surfaces respectively extending between ones of the plurality of protrusion portions toward a center of an adjacent one of the recess portions;
   a pixel unit configured to emit light on the display substrate, the pixel unit comprising a plurality of pixels;
   a first wiring coupled to the pixel unit and elongated in a first direction; and
   a second wiring elongated in a second direction crossing the first direction,
   wherein the plurality of pixels are disposed on the plurality of protrusion portions between the plurality of recess portions, and
   wherein a width of each of the recess portions is larger than a width of each of the pixels.

2. The flexible display device of claim 1, wherein a slope of each of the curved surfaces varies from the protrusion portion toward a center of the recess portion.

3. The flexible display device of claim 2, wherein the slope of each of the curved surfaces is smooth from the protrusion portion toward the center of the recess portion.

4. The flexible display device of claim 3, further comprising:
   a pixel protection layer on the pixel unit.

5. The flexible display device of claim 1, wherein the first wiring is a gate wire connected to a gate electrode of a thin film transistor of the pixel unit.

6. The flexible display device of claim 1, wherein the first wiring is elongated along one of the curved surfaces of one of the recess portions.

7. The flexible display device of claim 1, wherein the first wiring is spaced from one of the curved surfaces of one of the recess portions.

8. The flexible display device of claim 1, wherein a portion of each of the curved surfaces has a slope which is inclined in a direction away from a center of the one of the respective recess portion.

9. The flexible display device of claim 1, wherein a center of at least one of the recess portions has a planar surface.

10. The flexible display device of claim 1, wherein ones of the plurality of protrusion portions have a height that is different from other ones of the plurality of protrusion portions.

11. The flexible display device of claim 1, wherein the plurality of the protrusion portions of the display substrate form the recess portions which extend in two directions.

12. The flexible display device of claim 1, wherein the display substrate has a plurality of regions, and
   wherein ones of the plurality of protrusion portions in one of the plurality of regions have different characteristics than ones of the plurality of protrusion portions in another one of the plurality of regions.

13. The flexible display device of claim 12, wherein the plurality of regions are arranged along a longitudinal direction.

14. The flexible display device of claim 12, wherein the plurality of regions comprises a first region extending across a center of the display substrate and a second region extending to an edge of the display substrate.

15. A flexible display substrate comprising:
   a plurality of protrusion portions and a plurality of recess portions in one surface thereof and curved surfaces respectively extending from a boundary of the plurality of protrusion portions toward a center of an adjacent one of the plurality of recess portions; and
   a plurality of pixels disposed on the plurality of protrusion portions between the plurality of recess portions,
   wherein a width of each of the recess portions is larger than a width of each of the pixels.

16. The flexible display substrate of claim 15, wherein each of the curved surfaces has a slope that varies in a direction from the boundary of one of the protrusion portions toward the center of a respective one of the recess portions.

17. The flexible display substrate of claim 16, wherein the slope is smooth.

18. The flexible display substrate of claim 16, wherein the slope at a portion of each of the curved surfaces is inclined in a direction away from the center of the respective one of the recess portions.

19. The flexible display substrate of claim 15, wherein a center of at least one of the recess portions is planar.

20. The flexible display substrate of claim 15, wherein ones of the plurality of protrusion portions have different heights from each other.

21. The flexible display substrate of claim 15, wherein the plurality of protrusion portions is formed by the plurality of recess portions extending in two directions.

22. The flexible display substrate of claim 15, wherein the flexible display substrate has a plurality of regions, and wherein at least two regions from among the plurality of regions comprise ones of the plurality of protrusion portions and ones of the plurality of recess portions, respectively, having different characteristics.

23. The flexible display substrate of claim 22, wherein the plurality of regions extend in a longitudinal direction and comprises a first region extending across a center of the flexible display substrate and a second region extending to an edge of the flexible display substrate.

24. The flexible display substrate of claim 22, wherein the plurality of regions comprises a first region extending across a center of the flexible display substrate and a second region extending to an edge of the flexible display substrate.

* * * * *